(12) United States Patent
Pahwa et al.

(10) Patent No.: US 12,099,737 B2
(45) Date of Patent: Sep. 24, 2024

(54) TEMPERATURE CONTROLLED ZONE CREATION AND ALLOCATION

(71) Applicant: MICRON TECHNOLOGY, INC., Boise, ID (US)

(72) Inventors: Shiva Pahwa, Bangalore (IN); Abhilash Ramamurthy Nag, Bangalore (IN); Sathyashankara Bhat Muguli, Bangalore (IN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/884,478

(22) Filed: Aug. 9, 2022

(65) Prior Publication Data
US 2023/0185471 A1 Jun. 15, 2023

(30) Foreign Application Priority Data
Dec. 14, 2021 (IN) .............................. 202141058141

(51) Int. Cl.
*G06F 3/06* (2006.01)
(52) U.S. Cl.
CPC .......... *G06F 3/0644* (2013.01); *G06F 3/0604* (2013.01); *G06F 3/0653* (2013.01); *G06F 3/0679* (2013.01)
(58) Field of Classification Search
CPC ...... G05B 13/00–048; G05B 15/00–02; G05B 17/00–02; G06F 1/00–3296; G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 18/00–41; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G06N 3/00–126; G06N 5/00–048; G06N 7/00–08; G06N 10/00; G06N 20/00–20; G06N 99/00–007; G06T 1/00–60; G06V 30/00–43; G11B 20/00–24; G11B 33/00–1493; G11C 11/00–5692;

(Continued)

(56) References Cited

U.S. PATENT DOCUMENTS

| 5,594,924 | A * | 1/1997 | Ottesen | G11B 5/5526 725/116 |
| 8,363,519 | B2 * | 1/2013 | Lubbers | G06F 3/0647 369/47.1 |
| 8,775,731 | B2 * | 7/2014 | McHale | G06F 3/0611 711/114 |

(Continued)

*Primary Examiner* — Daniel C. Chappell
(74) *Attorney, Agent, or Firm* — Lowenstein Sandler LLP

(57) ABSTRACT

Respective temperature values for a plurality of dies of a memory device is obtained. Each respective temperature value is indicative of a temperature at a corresponding die of the plurality of dies of the memory device. The plurality of dies based on the respective temperature values, each die of the plurality of dies is ordered. A zone creation command directed to the memory device is received from a host. The zone creation command on the memory device on a die of the ordered plurality of dies is performed based on a temperature threshold.

20 Claims, 7 Drawing Sheets

(58) Field of Classification Search
CPC ...... G11C 13/00–06; G11C 14/00–009; G11C 15/00–06; G11C 16/00–3495; G11C 17/00–18; G11C 2207/00–229; G11C 2216/00–30; H01L 25/00–50; H01L 2225/00–1094; H03M 7/00–707; H04L 9/00–38; H04L 12/00–66; H04L 41/00–5096; H04L 49/00–9094; H04L 61/00–59; H04L 67/00–75
See application file for complete search history.

(56) References Cited

U.S. PATENT DOCUMENTS

| | | | | |
|---|---|---|---|---|
| 9,342,443 | B2 * | 5/2016 | Walker | G06F 12/023 |
| 9,760,437 | B2 * | 9/2017 | Chinnakkonda Vidyapoornachary | G06F 3/0619 |
| 10,409,526 | B2 * | 9/2019 | Zhang | G06F 3/0652 |
| 10,685,306 | B2 * | 6/2020 | Dannecker | G06F 16/2477 |
| 11,221,802 | B2 * | 1/2022 | Reusswig | G06F 3/0607 |
| 11,281,400 | B2 * | 3/2022 | Cariello | G06F 3/0604 |
| 11,467,729 | B2 * | 10/2022 | Kono | G06F 3/067 |
| 11,593,018 | B2 * | 2/2023 | Bhardwaj | G06F 3/0652 |
| 11,789,612 | B2 * | 10/2023 | Inbar | G06F 3/0679 711/3 |
| 11,853,612 | B2 * | 12/2023 | Hodes | G06F 3/0635 |
| 2008/0005475 | A1 * | 1/2008 | Lubbers | G06F 3/0676 711/118 |
| 2014/0281311 | A1 * | 9/2014 | Walker | G06F 3/0631 711/170 |
| 2016/0179398 | A1 * | 6/2016 | Ioannou | G06F 3/0608 711/103 |
| 2020/0285298 | A1 * | 9/2020 | Basu | G06F 1/3275 |
| 2021/0182166 | A1 * | 6/2021 | Hahn | G06F 11/3034 |
| 2021/0405874 | A1 * | 12/2021 | Kono | G06F 9/5077 |

* cited by examiner

TEMPERATURE CONTROLLED ZONE CREATION AND ALLOCATION

TECHNICAL FIELD

Embodiments of the disclosure relate generally to memory sub-systems, and more specifically, relate to temperature controlled zone creation and allocation in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
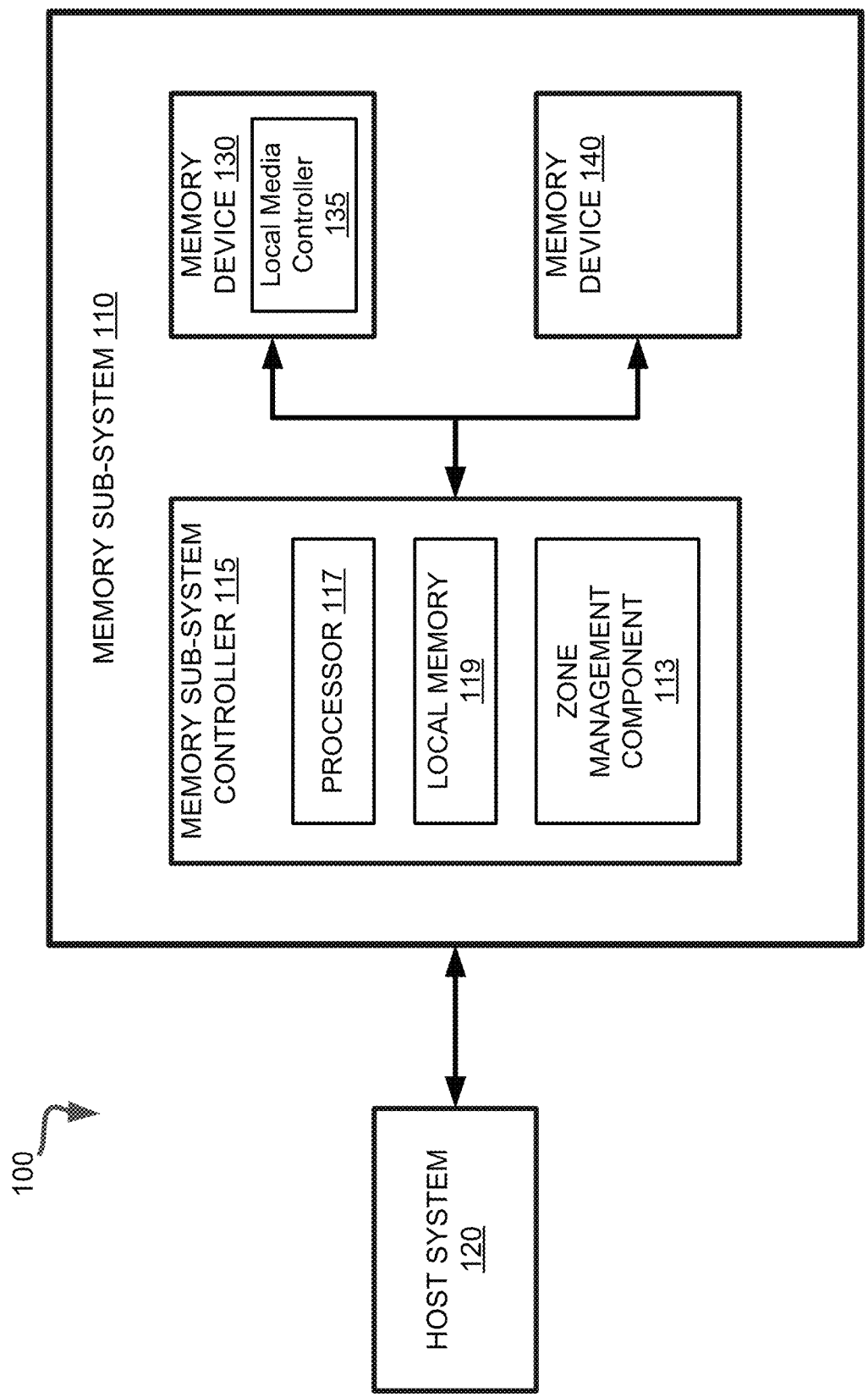
FIG. 1 illustrates an example computing system that includes a memory sub-system in accordance with some embodiments of the present disclosure.

Aspects of the present disclosure are directed to temperature controlled zone creation and allocation. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies (or logical units (LUs) identified by logical numbers (LUNs)). Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

Certain memory devices are also configured with a zoned namespace. In a zoned namespace, the address space (e.g., logical block address space) of the memory device (or memory sub-system) is divided into zones which allows for more efficient management of data as the capacity of the memory device increases. Each zone of the memory device may be configured to have similar capacity. For example, each individual zone can be designated for use by a specific client application executed by the host system or some other system with access to the memory device. In a memory device or memory sub-system, one or more zoned namespaces can be implemented, and each zoned namespace can implement one or more zones. A zone can include multiple zone memory units. Each zone can be addressed using a portion of the address space of the memory device or memory sub-system. Data can be written to a particular zone sequentially and independently from other zones.

Client applications are increasingly capable of managing zoned namespaces thereby providing the client applications the ability to manage storage capacity and other functions of the memory device. However, client applications even with the increased capability of managing zoned namespaces are unaware of the physical structure of the memory device and its behavior under varying conditions. For example, during a request to create a zone by a client application based on operation requirements of the client application, the client application may request creation of a zone on a portion of the memory device (e.g., die) that is already above an ideal operating temperature of the memory device. Allocation and use of the created zone that is already above the ideal operating temperature of the memory device may result in further increase in the temperature of the die of the memory device.

In typical conventional memory sub-systems, memory sub-system operations, such as, media management operations and garbage collection operations may be used to assist in temperature management of the die of the memory device to reduce temperature. As a result, these memory sub-system operations typically increase write amplification and wearing of the memory device. Accordingly, performance of the memory device and host input/output (I/O) operations is drastically affected.

Aspects of the present disclosure address the above and other deficiencies by having a memory sub-system that obtains temperature of various dies of the memory device. In some embodiments, the dies of the memory device may be limited to dies of the memory device that are available for zone creation. Depending on the embodiment, the various dies of the memory device may be ordered by their respective temperature value in order from coolest die to hottest die. Once a client application request creation or allocation of a new zone in the memory device, a die from the various dies having a temperature value less than the ideal operating temperature of the memory device is selected for zone creation and allocation to the client application. Depending on the embodiment, the first die from the ordered various dies is selected to determine whether the temperature value associated with the first die is less than the ideal operating temperature of the memory device. Based on determining that the first die is less than the ideal operating temperature of the memory device, the first die is selected for creation and allocation of a new zone to the client application.

Advantages of the present disclosure include, but are not limited to, maintaining the memory device at an optimal operating temperature by evenly distributing temperature across the memory device, reducing cooling cost associated with maintaining the memory device at the optimal operating temperature, and increasing endurance of the memory device associated with a reduction in write amplification.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a zone management component 113 that can monitor temperature of a plurality of dies in the non-volatile memory device (e.g., memory device 130). Depending on the embodiment, the zone management component 113 may obtain temperatures of the plurality of dies from a temperature sensor disposed on the respective die. In some embodiments, the temperature sensor may be disposed on the memory device surrounding a subset of the plurality of dies. Accordingly, a temperature value obtained by the temperature sensor disposed near the subset of the plurality of dies would be applied to all of the dies in the subset of the plurality of dies. In some embodiments, the temperature of the dies of the plurality of dies that are available for zone creation are monitored.

Based on the temperature value of each die of the plurality of dies in the non-volatile memory device, the zone management component 113 may order the plurality of dies from a coolest die (e.g., a die of the plurality of dies with the lowest temperature value) to a hottest die (e.g., a die of the plurality of dies with the highest temperature value). Depending on the embodiment, to order the plurality of dies, the zone management component 113 may order the plurality of dies in a linked list or any suitable structure capable of maintaining the order of the plurality of dies by temperature values. In some embodiments, the ordered plurality of dies may be dies of the plurality of dies that are available for zone creation.

The zone management component 113, in response to receiving a request to create a zone or allocate a new zone in memory device 130, can determine and select a die of the plurality of dies that is less than or equal to a predetermined temperature value (e.g., an optimal operating temperature of memory device 130). In some embodiments, the zone management component 113 may compare a temperature value of the first die in the ordered plurality of dies with the predetermined temperature value to determine if the temperature value is less than or equal to the predetermined temperature value. Based on the die associated with a temperature value that is less than the predetermined temperature value, the zone management component 113 may create a zone in the die.

Depending on the embodiment, once the zone is created, the zone management component 113 may continue to monitor the temperature of the plurality of dies to determine whether the ordered plurality of dies needs to be reordered. Based on changes in the temperature values, the plurality of dies are reordered based on their new respective temperature values. Depending on the embodiments, the die in which the zone was created remains in the ordered list. In some embodiments, the die may not contain any additional space for zone creation or is not available for zone creation, thus, the zone management component 113 may removes the die from the ordered plurality of dies. Accordingly, the only remaining dies are those available for zone creation. Further details with regards to the operations of the zone management component 113 are described below.

In some embodiments, the memory sub-system controller 115 includes at least a portion of the zone management component 113. In some embodiments, the zone management component 113 is part of the host system 110, an application, or an operating system. In other embodiments, local media controller 135 includes at least a portion of zone management component 113 and is configured to perform the functionality described herein.

Figure 2A:
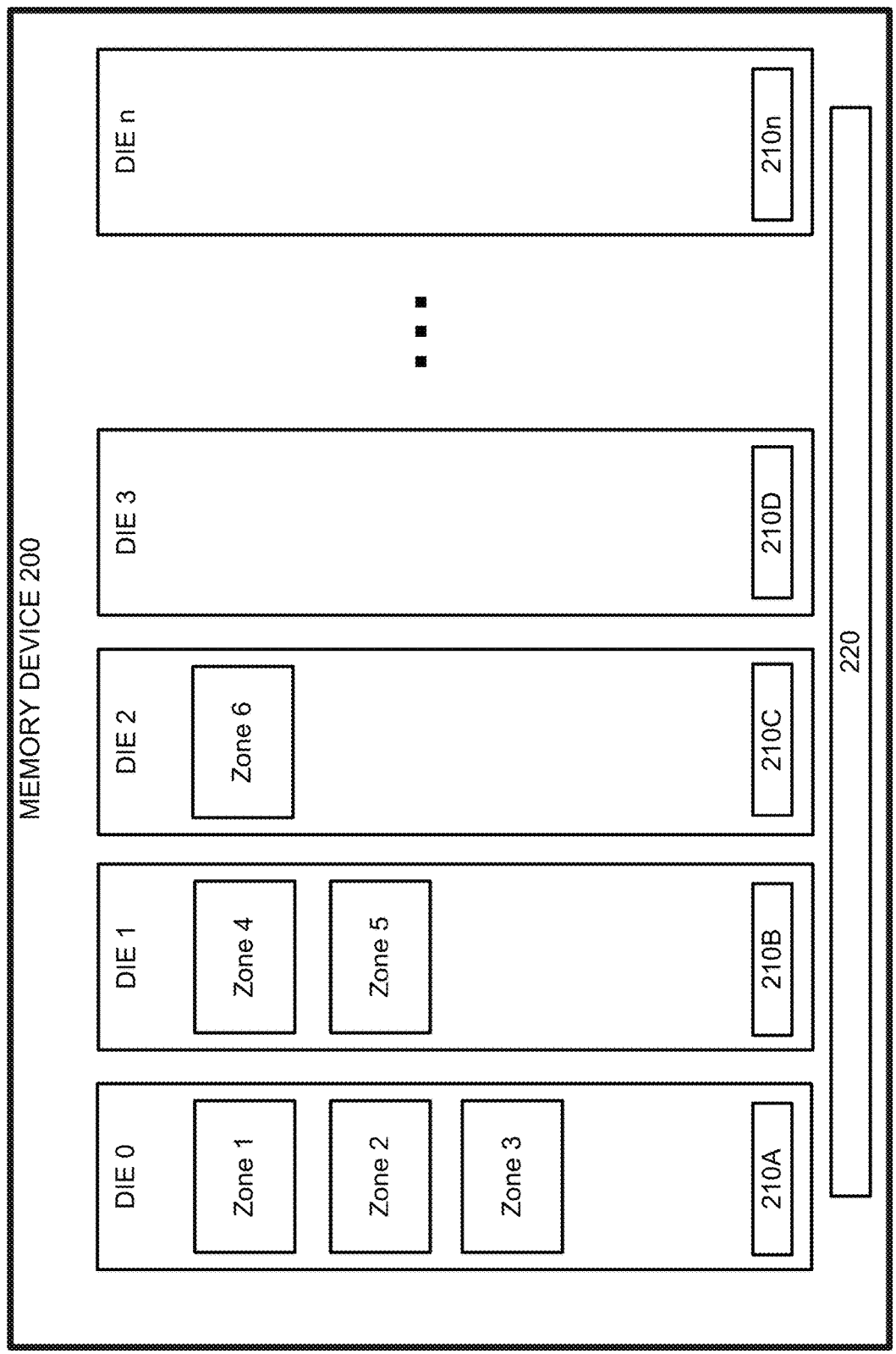
FIG. 2A-2C illustrates creating a zone in a zoned namespace based on temperature in accordance with some embodiments of the present disclosure.
Figure 2B:
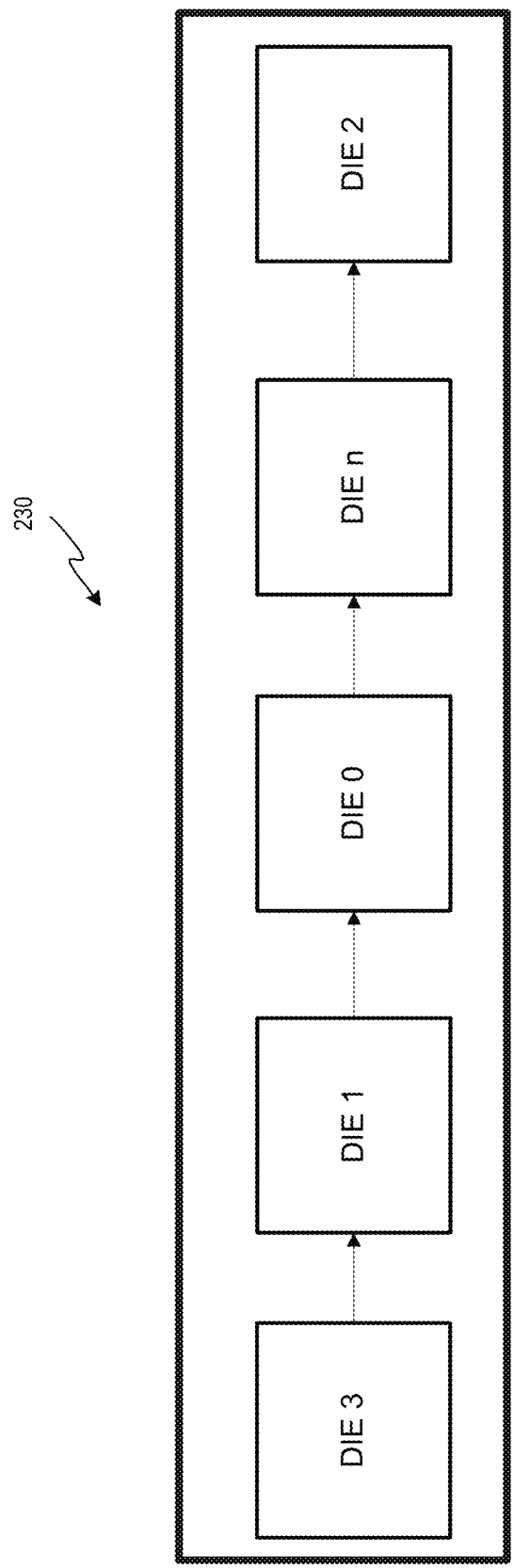
Figure 2C:
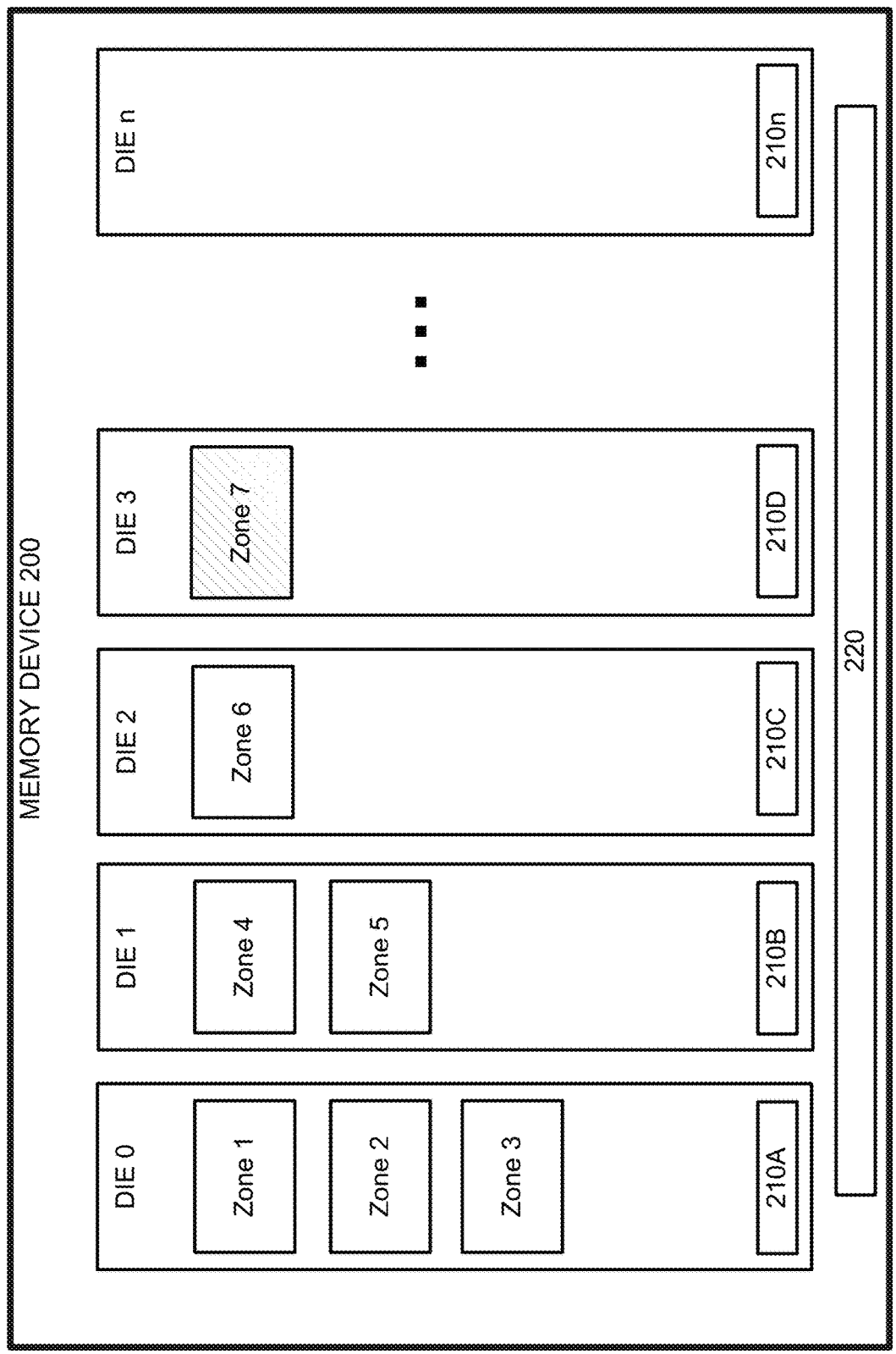

FIG. 2A-2C are block diagrams illustrating creating zones in a zoned namespace in non-volatile memory device 200. Referring to FIG. 2A, the memory device 200 includes a plurality of dies (e.g., DIE 0-DIE n). Memory device 200 can represent either memory device 130 and/or 140. Each die of the plurality of dies may be hierarchically organized by plane, block, and page. Each die of the plurality of dies may include at least one zone (e.g., zones 1-zone 6) defined by a grouping of planes, blocks and/or pages of the dies. For example, DIE 0 includes zones 1, zone 2, and zone 3; DIE 1 include zones 4 and zone 5; and DIE 2 includes zone 6. Depending on the embodiment, different dies may include a different number of zones or contain no zones (e.g., DIE 3 and DIE n). Accordingly, each die that contains available space in the planes, blocks, and/or pages of the die may be suitable for zone creation. Each zone of a die (e.g., zone 1 of DIE 0) may be allocated and utilized by a client application. Each die of the plurality of dies may include a respective temperature sensor (e.g., 210A-210n), for example, DIE 0 may have a temperature sensor 210A to obtain a respective temperature value at DIE 0. Additionally, and/or alternatively, memory device 200 may include a temperature sensor 220 that monitors a respective temperature value for the plurality of dies in close proximity to the temperature sensor 220. In some instances, the temperature sensor (e.g., 210A-210n) is not available to provide a temperature value for a respective die (e.g., DIE 0-DIE n), however, the temperature sensor 220 may provide a temperature value for the respective dies in close proximity to the temperature sensor 220. Accordingly, the temperature value measured at temperature sensor 220 may be assigned to dies of the plurality of dies in close proximity to the temperature sensor 220.

Responsive to receiving a request to create a zone in a die of the plurality of dies, zone management component 113 obtains a temperature value of each of the plurality of dies (e.g., DIE 0 to DIE n) based on a reading from the plurality of temperature sensors coupled to the plurality of dies (e.g., 210A-210n). Accordingly, the zone management component 113 receives a plurality of temperature values associated with the plurality of dies. Referring to FIG. 2B, once the plurality of temperature values associated with the plurality of dies are received, the zone management component 113 orders the plurality of dies (e.g., DIE 0-DIE n) by their respective temperature values. The plurality of dies may be ordered in a linked list 230 which is stored in the memory device (e.g., memory device 130, 140). The linked list 230 may order the plurality of dies from the die associated with a lowest temperature value of the plurality of temperature values (e.g., DIE 3) to the die associated with a highest temperature value of the plurality of temperature values (e.g., DIE 2). Depending on the embodiment, the linked list 230 may include only dies of the plurality of dies that contain sufficient space to create a zone. Additionally, and/or alternatively, the linked list 230 may be further ordered by metadata associated with each die (e.g., program/erase (PE) cycle counts, garbage collection values, error rates, or etc.). In some embodiments, the linked list may be ordered from hottest to coldest or any suitable ordering of temperature.

Referring to FIG. 2C, upon receiving a request, from the host, to create and/or allocate a new zone to a client application, the zone management component 113 may select the first die (DIE 3) from the linked list 230 (referring to FIG. 2B) to compare with a predetermined temperature threshold. The predetermined temperature threshold refers to an optimal temperature value for memory device 200. In some embodiments, the optimal temperature value may be pre-selected. In some embodiments, the temperature value may be based on an optimal operating temperature according to Joint Electron Device Engineering Council (JEDEC), for example, 40° C. Upon determining that the temperature value of the first die (DIE 3) is less than or equal to the optimal temperature value, the zone management component 113 creates a zone (e.g., zone 7) within the first die (DIE 3). Once the zone is created, the zone management component 113 assigns the zone (e.g., zone 7) to the client application.

Figure 3:
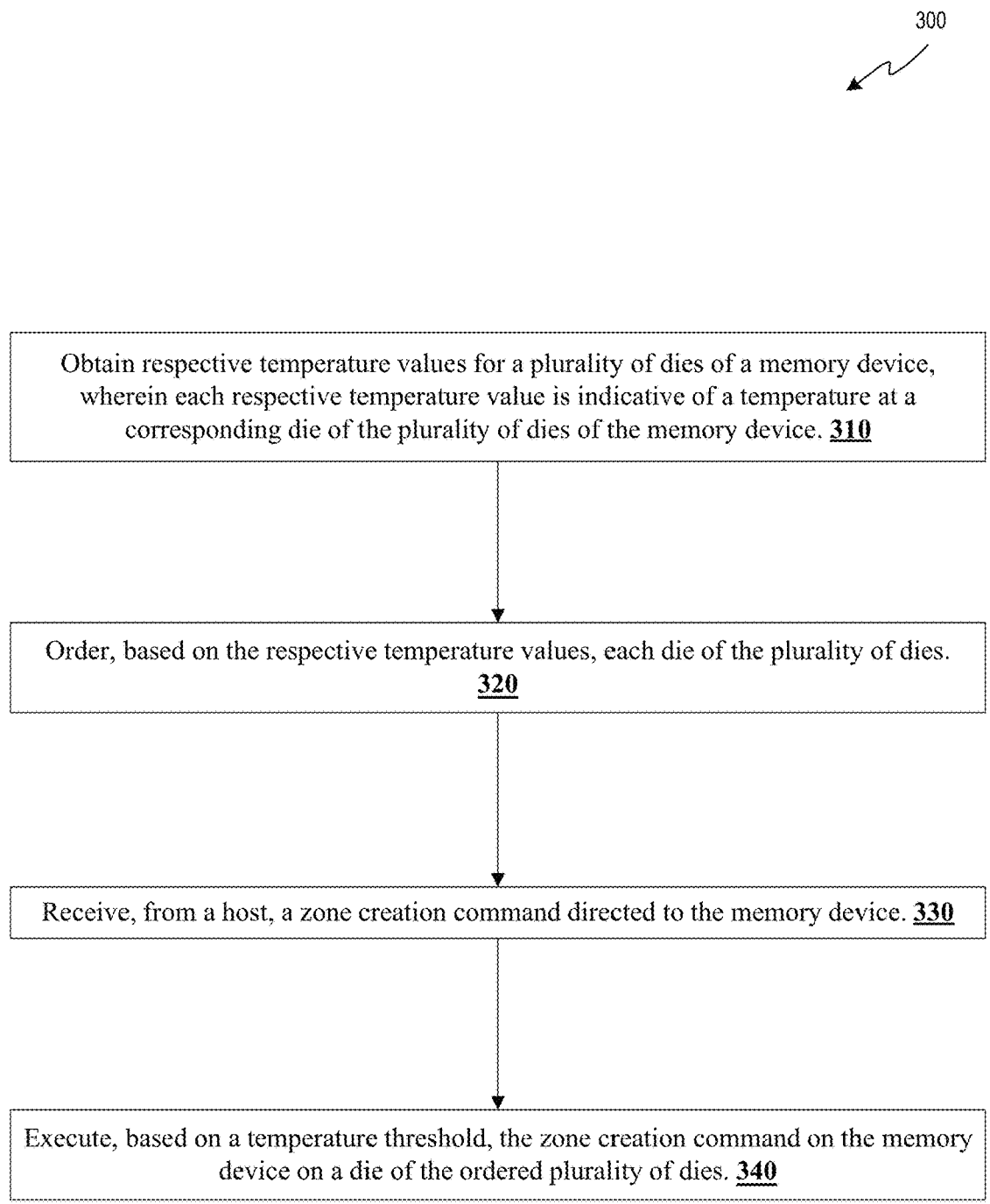
FIG. 3 is a flow diagram of an example method of creating and allocating zones in a zoned namespace based on temperature in accordance with some embodiments of the present disclosure.

FIG. 3 is a flow diagram of an example method 300 to create and allocate zones in a zoned namespace based on temperature, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the zone management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic obtains respective temperature values for a plurality of dies of the memory device. Each respective temperature value is indicative of a temperature at a corresponding die of the plurality of dies of the memory device. In some embodiments, to obtain the respective temperature values for the plurality of dies, the processing logic identifies the respective temperature values from at least one of: a temperature sensor coupled to a respective die of the plurality of dies or a temperature sensor in close proximity to the respective die of the plurality of dies. As previously described, each die of the plurality of dies may include a respective temperature sensor to obtain a respective temperature value at each die. Additionally, and/or alternatively, the memory device may include a temperature sensor that monitors a respective temperature value for the plurality of dies. Accordingly, the temperature sensor may obtain a temperature value for the respective dies in close proximity to the temperature sensor, thereby, assigning each die of the plurality of dies in close proximity the temperature value obtained by the temperature sensor.

At operation 320, the processing logic orders the plurality of dies based on the respective temperature values, each die of the plurality of dies. In some embodiments, to order the plurality of dies based on the respective temperature values, the processing logic generates a linked list of the plurality of dies starting with a die of the plurality of dies associated with a lowest temperature value to a die of the plurality of dies associated with a highest temperature value.

At operation 330, the processing logic receives, from a host, a zone creation command directed to the memory device. Upon, receiving, from the host, the zone creation command directed to the memory device, the processing logic, at operation 330, performs, based on a temperature threshold, the zone creation command on the memory device on a die of the ordered plurality of dies. The temperature threshold is based on a predetermined temperature for the memory device. As previously described, the predetermined temperature of the memory may be pre-selected or based on an optimal operating temperature, such as, according to Joint Electron Device Engineering Council (JEDEC). The zone creation command is a command to create a zone within a respective die of the plurality of dies of the memory device based on at least one portion of the respective die.

To perform, based on the temperature threshold, the zone creation command on the memory device on the die of the ordered plurality of dies, the processing logic determines whether a temperature value associated with a first die in the ordered plurality of dies is less than the temperature threshold. Responsive to determining that the temperature value associated with the first die in the ordered plurality of dies is less than the temperature threshold, the processing logic creates a zone within the first die in the ordered plurality of dies.

In some embodiments, the processing logic assigns the created zone within the first die to the host. Depending on the embodiment, the processing logic may determine whether the first die includes any additional space for zone creation, and responsive to determining that the first die does not include any additional space for zone creation, the processing logic may further remove the first die from the ordered plurality of dies.

In some embodiments, the processing logic obtains a new respective temperature value for each die of a plurality of dies of the memory device and reorders, based on the new respective temperature value for each die, the plurality of dies. Depending on the embodiment, the reordering may occur prior to creation of the zone, after creation of the zone, or during creation of the zone.

Figure 4:
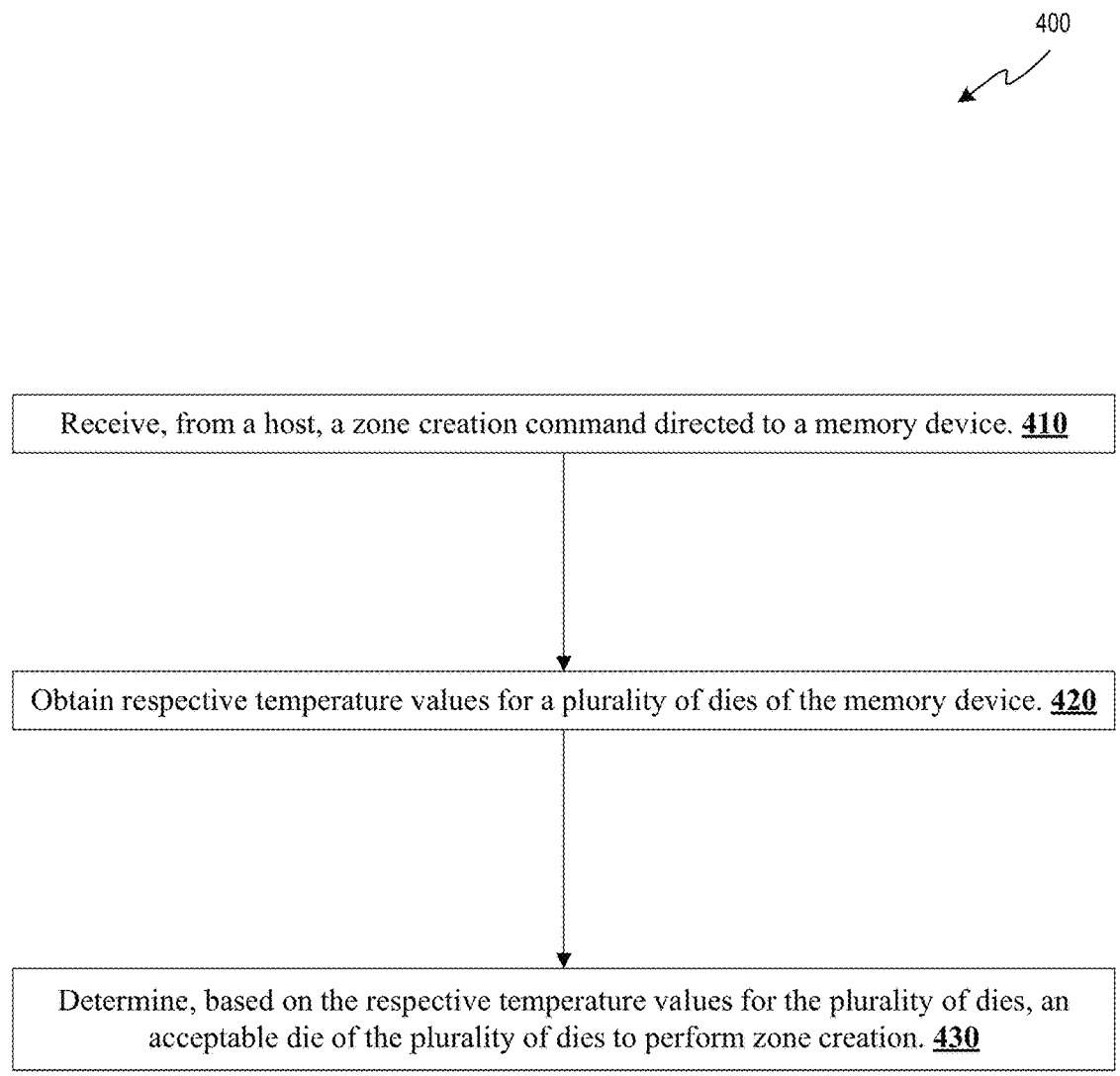
FIG. 4 is a flow diagram of an example method of creating and allocating zones in a zoned namespace based on temperature in accordance with some embodiments of the present disclosure.

FIG. 4 is a flow diagram of an example method 400 to create and allocate zones in a zoned namespace based on temperature, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the zone management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives, from a host, a zone creation command directed to a memory device. As previously described, the zone creation command is a command to create a zone within a respective die of the plurality of dies of the memory device based on at least one portion of the respective die.

At operation 420, the processing logic obtains respective temperature values for a plurality of dies of the memory device. As previously described, each respective temperature value is indicative of a temperature at a corresponding die of the plurality of dies of the memory device. In some embodiments, to obtain the respective temperature values for the plurality of dies, the processing logic identifies the respective temperature values from at least one of: a temperature sensor coupled to a respective die of the plurality of dies or a temperature sensor in close proximity to the respective die of the plurality of dies. As previously described, each die of the plurality of dies may include a respective temperature sensor to obtain a respective temperature value at each die. Additionally, and/or alternatively, the memory device may include a temperature sensor that monitors a respective temperature value for the plurality of dies. Accordingly, the temperature sensor may obtain a temperature value for the respective dies in close proximity to the temperature sensor, thereby, assigning each die of the plurality of dies in close proximity the temperature value obtained by the temperature sensor.

At operation 430, the processing logic determines, based on the respective temperature values for the plurality of dies, an acceptable die of the plurality of dies to perform zone creation. To determine, based on the respective temperature values for the plurality of dies, the acceptable die of the plurality of dies to perform zone creation, the processing logic identifies a die of the plurality of dies that is less than a predetermined temperature. As previously described, the predetermined temperature of the memory may be pre-selected or based on an optimal operating temperature, such as, according to Joint Electron Device Engineering Council (JEDEC). The zone creation command is a command to create a zone within a respective die of the plurality of dies of the memory device based on at least one portion of the respective die.

In some embodiments, to determine, based on the respective temperature values for the plurality of dies, the acceptable die of the plurality of dies to perform zone creation, the processing logic identifies a die of the plurality of dies associated with a lowest temperature value among the plurality of dies and that is less than a predetermined temperature. To determine the die of the plurality of dies associated with the lowest temperature value, the processing logic, may compare each die of the plurality of dies to determine which die is associated with the lowest temperature value. In some embodiments, to determine the die of the plurality of dies associated with the lowest temperature value, the processing logic, orders, based on the respective temperature values, each die of the plurality of dies by generating a linked list of the plurality of dies starting with a die of the plurality of dies associated with a lowest temperature value to a die of the plurality of dies associated with a highest temperature value. Accordingly, the first die in the linked list is associated with the die of the plurality of dies with the lowest temperature value.

In some embodiments, the processing logic performs zone creation on the acceptable die of the plurality of dies. Depending on the embodiment, the processing logic assigns the created zone within the acceptable die of the plurality of dies to the host. Depending on the embodiment, the processing logic may determine whether the acceptable die includes any additional space for zone creation, and responsive to determining that the acceptable die does not include any additional space for zone creation, the processing logic may further remove the acceptable die from the linked list prior to reordering.

Figure 5:
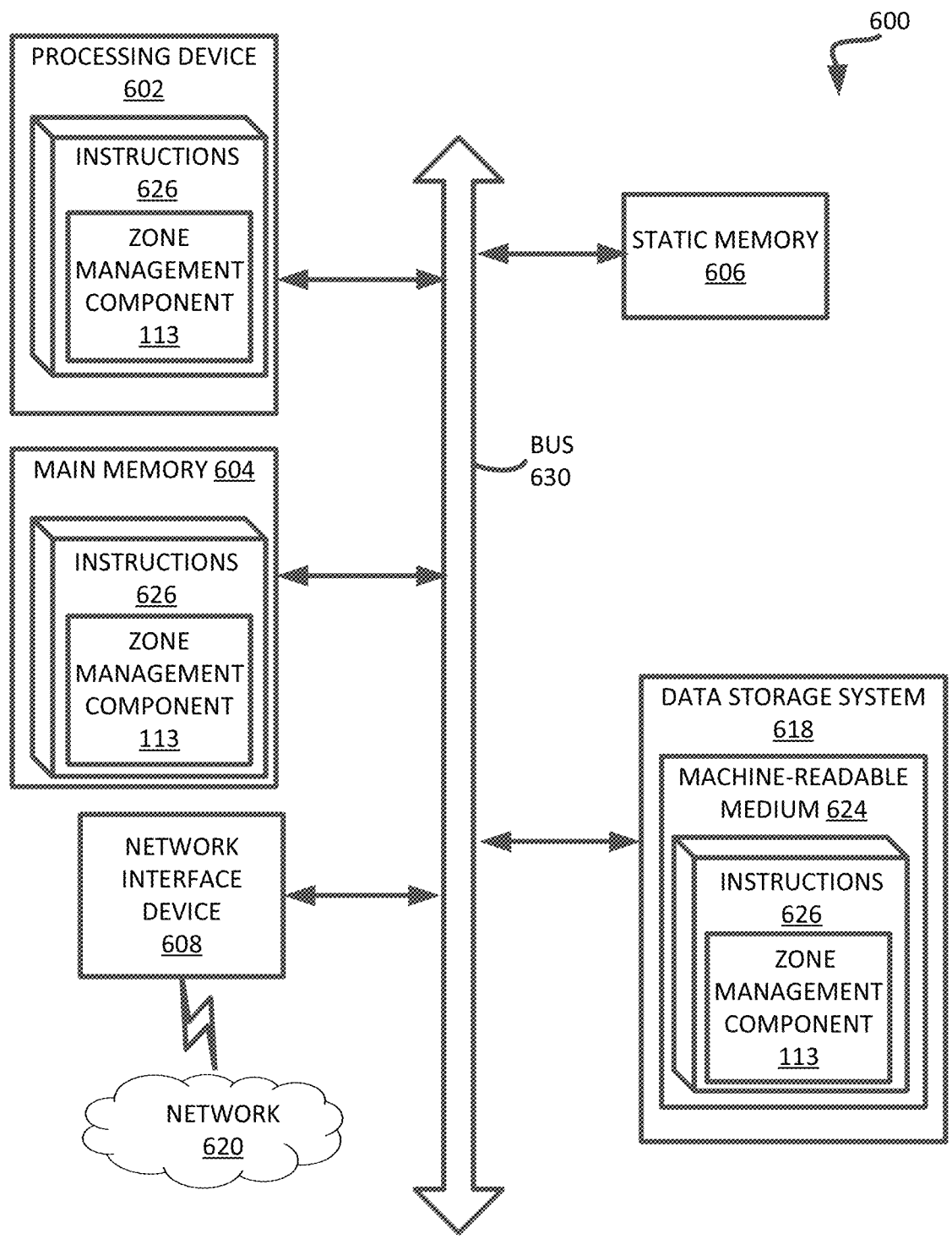
FIG. 5 is a block diagram of an example computer system in which embodiments of the present disclosure may operate.

FIG. 5 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the zone management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a zone management component (e.g., the zone management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device coupled to the memory device, the processing device to perform operations comprising:
   obtaining respective temperature values for a plurality of dies of the memory device, wherein each respective temperature value is indicative of a temperature at a corresponding die of the plurality of dies of the memory device;
   ordering, based on the respective temperature values, each die of the plurality of dies to create an ordered linked list of dies available for zone creation;
   receiving, from a host, a zone creation command directed to the memory device;
   selecting, based on a temperature threshold, an acceptable die of the ordered linked list of dies for the zone creation command; and
   executing, by the processing device, the zone creation command on the memory device to create a zone allocated to the host within the acceptable die, wherein the zone comprises a portion of an address space of the memory device.

2. The system of claim 1, wherein obtaining the respective temperature values for the plurality of dies comprises identifying the respective temperature values from at least one of: a temperature sensor coupled to a respective die of the plurality of dies or a temperature sensor in close proximity to the respective die of the plurality of dies.

3. The system of claim 1, wherein ordering the plurality of dies based on the respective temperature values comprises generating the linked list dies starting with a die of the plurality of dies associated with a lowest temperature value and proceeding to a die of the plurality of dies associated with a highest temperature value.

4. The system of claim 1, wherein the temperature threshold is based on a predetermined temperature for the memory device.

5. The system of claim 1, wherein the zone creation command is a command to create a zone within a respective die of the plurality of dies of the memory device based on at least one portion of the respective die.

6. The system of claim 1, wherein executing the zone creation command comprises:
   determining whether a temperature value associated with a first die in the ordered linked list of dies is less than the temperature threshold; and
   responsive to determining that temperature value associated with the first die in the ordered linked list of dies is less than the temperature threshold, creating a zone within the first die in the ordered linked list of dies.

7. The system of claim 6, wherein the processing device is to perform operations further comprising:
   assigning the created zone within the first die to the host;
   determining whether the first die includes any additional space for zone creation; and
   responsive to determining that the first die does not include any additional space for zone creation, removing the first die from the ordered linked list of dies.

8. The system of claim 1, wherein the processing device is to perform operations further comprising:
   obtaining a new respective temperature value for each die of a plurality of dies of the memory device; and
   reordering, based on the new respective temperature value for each die, the linked list of dies.

9. A method comprising:
   obtaining respective temperature values for a plurality of dies of a memory device, wherein each respective temperature value is indicative of a temperature at a corresponding die of the plurality of dies of the memory device;
   ordering, based on the respective temperature values, each die of the plurality of dies to create an ordered linked list of dies available for zone creation;
   receiving, from a host, a zone creation command directed to the memory device;
   selecting, based on a temperature threshold, an acceptable die of the ordered linked list of dies for the zone creation command; and
   executing, the zone creation command on the memory device to create a zone allocated to the host within the acceptable die, wherein the zone comprises a portion of an address space of the memory device.

10. The method of claim 9, wherein obtaining the respective temperature values for the plurality of dies comprises identifying the respective temperature values from at least one of: a temperature sensor coupled to a respective die of the plurality of dies or a temperature sensor in close proximity to the respective die of the plurality of dies.

11. The method of claim 9, wherein ordering the plurality of dies based on the respective temperature values comprises generating the linked list of dies starting with a die of the plurality of dies associated with a lowest temperature value and proceeding to a die of the plurality of dies associated with a highest temperature value.

12. The method of claim 9, wherein the temperature threshold is based on a predetermined temperature for the memory device.

13. The method of claim 9, wherein the zone creation command is a command to create a zone within a respective die of the plurality of dies of the memory device based on at least one portion of the respective die.

14. The method of claim 9, wherein executing, based on a temperature threshold, the zone creation command comprises:
   determining whether a temperature value associated with a first die in the ordered linked list of dies is less than the temperature threshold; and
   responsive to determining that the temperature value associated with the first die in the ordered linked list of dies is less than the temperature threshold, creating a zone within the first die in the ordered linked list of dies.

15. The method of claim 14, further comprising:
   assigning the created zone within the first die to the host;
   determining whether the first die includes any additional space for zone creation; and
   responsive to determining that the first die does not include any additional space for zone creation, removing the first die from the ordered linked list of dies.

16. The method of claim 9, further comprising:
   obtaining a new respective temperature value for each die of a plurality of dies of the memory device; and
   reordering, based on the new respective temperature value for each die, the linked list of dies.

17. A non-transitory computer-readable medium comprising instructions that, responsive to execution by a processing device, cause the processing device to perform operations comprising:
   receiving, from a host, a zone creation command directed to a memory device;
   obtaining respective temperature values for a plurality of dies of the memory device; and
   ordering, based on the respective temperature values, each die of the plurality of dies to create an ordered linked list of dies available for zone creation;
   selecting, based on a temperature threshold, an acceptable die of the ordered linked list of dies ordered based on respective temperatures of the plurality of dies for the zone creation command, wherein the zone creation command creates a zone comprising a portion of an address space of the memory device.

18. The non-transitory computer-readable medium of claim 17, wherein selecting, based on the temperature threshold, the acceptable die of the ordered linked list of dies to perform zone creation includes identifying a die of the ordered linked list of dies that is less than a predetermined temperature.

19. The non-transitory computer-readable medium of claim 17, wherein selecting, based on the temperature threshold, the acceptable die of the ordered linked list of dies to perform zone creation includes identifying a die of the ordered linked list of dies associated with a lowest temperature value among the ordered linked list of dies and that is less than a predetermined temperature.

20. The non-transitory computer-readable medium of claim 17, wherein causing the processing device to further perform operations comprising:
   executing zone creation on the acceptable die of the ordered linked list of dies.

* * * * *

UNITED STATES PATENT AND TRADEMARK OFFICE
CERTIFICATE OF CORRECTION

PATENT NO. : 12,099,737 B2
APPLICATION NO. : 17/884478
DATED : September 24, 2024
INVENTOR(S) : Shiva Pahwa, Abhilash Ramamurthy Nag and Sathyashankara Bhat Muguli It is certified that error appears in the above-identified patent and that said Letters Patent is hereby corrected as shown below:

In the Claims

In Claim 17, Column 16, Line 7 please insert --and-- after the ";"

Signed and Sealed this
Tenth Day of December, 2024

Katherine Kelly Vidal
*Director of the United States Patent and Trademark Office*